United States Patent [19]

Davis et al.

[11] Patent Number: 4,774,710

[45] Date of Patent: Sep. 27, 1988

[54] APPARATUS AND METHOD FOR CONTROLLING A LASER DIODE TO GENERATE A LINEAR ILLUMINATIVE OUTPUT

[75] Inventors: James G. Davis; James A. Hardy, both of Rochester, N.Y.

[73] Assignee: Eastman Kodak Company, Rochester, N.Y.

[21] Appl. No.: 142,058

[22] Filed: Jan. 7, 1988

[51] Int. Cl.$^4$ .............................................. H01S 3/10
[52] U.S. Cl. ......................................... 372/9; 372/38; 372/29
[58] Field of Search ..................... 372/9, 29, 38, 26, 8, 372/31; 455/613, 618

[56] References Cited

U.S. PATENT DOCUMENTS

| | | | |
|---|---|---|---|
| 4,000,322 | 8/1987 | Simons | 372/29 |
| 4,009,385 | 2/1977 | Sell | 250/199 |
| 4,177,432 | 12/1979 | Dixon et al. | 372/38 |
| 4,237,427 | 12/1980 | Holland | 331/94.5 S |
| 4,339,822 | 7/1982 | Kolodzey | 372/26 |
| 4,385,387 | 5/1983 | Trimmel | 372/29 |
| 4,412,331 | 10/1983 | Chapman | 372/29 |
| 4,450,564 | 5/1984 | Meuleman et al. | 372/26 |
| 4,583,128 | 4/1986 | Anderson, Jr. et al. | 358/302 |
| 4,592,057 | 5/1986 | Comerford | 372/8 |
| 4,713,819 | 12/1982 | Yoshikawa | 372/9 |

*Primary Examiner*—Leon Scott, Jr.
*Attorney, Agent, or Firm*—Robert H. Sproule

[57] ABSTRACT

A controller for a laser diode causes the diode to generate an illuminative output which varies linearly in response to changes in image signals which range between minimum and maximum brightness levels. A switchover point between first and second modes of operation is selected to be above the knee region of the laser diode operating curve. If the input signal values are above the switchover point, diode illuminative output is a function of these signal values. However, if the input signal values are below the switchover point, then the input signals are modulated to switch the diode several times between an "on" state which is above the knee region and an "off" state, to form one picture element (pixel). In order to vary the illuminative output as a linear function of the change in image signal level, the diode "on" time during formation of one pixel is a function of the image signal value.

10 Claims, 5 Drawing Sheets

APPARATUS AND METHOD FOR CONTROLLING A LASER DIODE TO GENERATE A LINEAR ILLUMINATIVE OUTPUT

TECHNICAL FIELD

The present invention pertains to apparatus and methods for controlling a leaer diode so that an illuminative output of the diode changes in a linear manner in response to changing input signals.

BACKGROUND OF THE INVENTION

It is common knowledge that the illuminative output of a semiconductor laser diode is not linear across its entire operating range. More specifically, in a typical graph of light output as a function of a voltage differential across the diode, the resulting curve has a lower level, nonlinear operating region, joined by a knee region to a higher level operating region where light output varies linearly as a function of the voltage differential.

The laser diode has been used frequently as a light source in a variety of photographic applications. For example, in the field of laser printing, a laser beam is focused through a lens and then scanned onto a negative film. The diode is often controlled by digital image data stored in a computer. In some systems, the laser is operated so that it is completely on or off, thereby generating either black or white pixels to form an image in response to the image signals. However, image quality may be improved by forming the image from pixels having varying gray tones. More specifically, when gradations in intensities of the gray levels is such that the transitions between pixels appear relatively smooth, this is referred to as a "continuous tone" image.

In order to generate these varying gray tones, the laser diode can be conventionally modulated so as to adjust its light output over a limited range. However, creating the desired gray tones from digital image data across a spectrum of white to black, can present a problem when the diode does not operate in a linear manner across its operating range from essentially zero light output to maximum illuminative intensity.

Conventionally, a number of laser diode control systems have been disclosed. For example, in U.S. Pat. No. 4,009,385 by Sell, there is disclosed a circuit for prebiasing a laser diode with a current near the diode's threshold point so as to minimize any delay in the laser responding to an input signal.

Another controller for a laser diode, described in U.S. Pat. No. 4,592,057 by Comerford, utilizes a programmable current source which is responsive to an error signal in order to drive the laser.

In U.S. Pat. No. 4,339,822 by Kolodzey there is disclosed a method for modulating a laser diode wherein a TTL or ECL signal input is converted to an ECL compatible output which is then amplified sufficiently to drive the diode.

Another prebiasing circuit is disclosed in U.S. Pat. No. 4,385,387 by Trimmel, in which a laser diode is prebiased for operation above the knee of a light-current characteristic curve.

Chapman, in U.S. Pat. No. 4,412,331, discloses a circuit for controlling the DC bias current of a laser diode so as to operate the diode at its knee.

In addition, in U.S. Pat. No. 4,583,128 by Anderson, Jr. et al there is disclosed a system for providing continuous tone images in which a photodiode continuously monitors the optical output of a laser diode and provides a feedback signal for adjusting the laser output.

Furthermore, Meuleman et al in U.S. Pat. No. 4,450,564, discloses a feedback circuit for reducing non-linear conversion characteristics and other variations in a laser diode by utilizing a photodiode which senses the output of the laser diode and generates a negative feedback signal to adjust the bias current of the laser diode.

And finally Holland, in U.S. Pat. No. 4,237,427, discloses a laser diode whose operation is affected by a first control loop which monitors the intensity of the laser output to develop a current signal for biasing the diode in response to a signal having a balanced duty factor, with a second control circuit operating to shut off the diode if the input signal duty factor becomes unbalanced.

SUMMARY OF THE INVENTION

The present invention pertains to a controller for a laser diode. The controller causes the diode to generate an illuminative output which varies linearly as the input signal to the diode changes. In an exemplary embodiment this input signal is generated from a stored image.

This is accomplished by operating the controller in a first mode when the image signal value is sufficient to operate the diode in the linear region above its knee. In this first mode, the diode output varies linearly with changes in the image signal values.

When the values of the image signal are below the knee region, in the so-called "nonlinear operating region" of the diode, linear operation is achieved by causing the diode to turn on (to a level in its linear operating region), and then off, several times per picture element (pixel) period. This is accomplished in a manner that the total "on" time of the diode, and hence the image pixel brightness, is a function of the image signal value.

More specifically, the present invention pertains to a controller for a laser diode having a characteristic operating curve which represents illuminative output as a function of input signal value; the curve including a lower nonlinear region, an upper linear region, and a knee region joining the linear and nonlinear regions. The controller includes receiver means for receiving input signals which are representative of an image. The values of the input signals vary linearly as the brightness of the image changes, with each signal value generating a picture element of the image. Also included are means for detecting the image signal values and for generating first control signals when the values of the input signals are above the knee region, and for generating second control signals when the input signal values are below the knee region.

In addition, there are means, responsive to the first control signals, for receiving the input signals which are above the knee region, and for generating first output signals which cause the laser diode to generate an illuminative output having values which vary linearly with changes in those input signal values which are above the knee region.

Furthermore, they are provided means, responsive to the second control signals, for receiving the input signals which are below the knee region and for generating second output signals which cause the laser diode to generate an illuminative output having values which vary linearly as the values of the input signals change. The second signal generating means further includes means for changing the values of the second output signals so as to cause the laser diode to alternate between an "on" state which is above its knee region, and an "off" state where there is substantially no illuminative output. This is accomplished in a manner that the time in which the laser diode is in the "on" state is a function of the input signal value.

It is therefor an object of the present invention to provide a controller for a laser diode which generates an illuminative output which varies linearly as a function of image signal input.

BRIEF DESCRIPTION OF THE DRAWINGS

These and other objects and advantages of the present invention will become more readily apparent upon reading the following detailed description in conjunction with the attached drawings, in which.

DETAILED DESCRIPTION OF THE INVENTION

Figure 1:
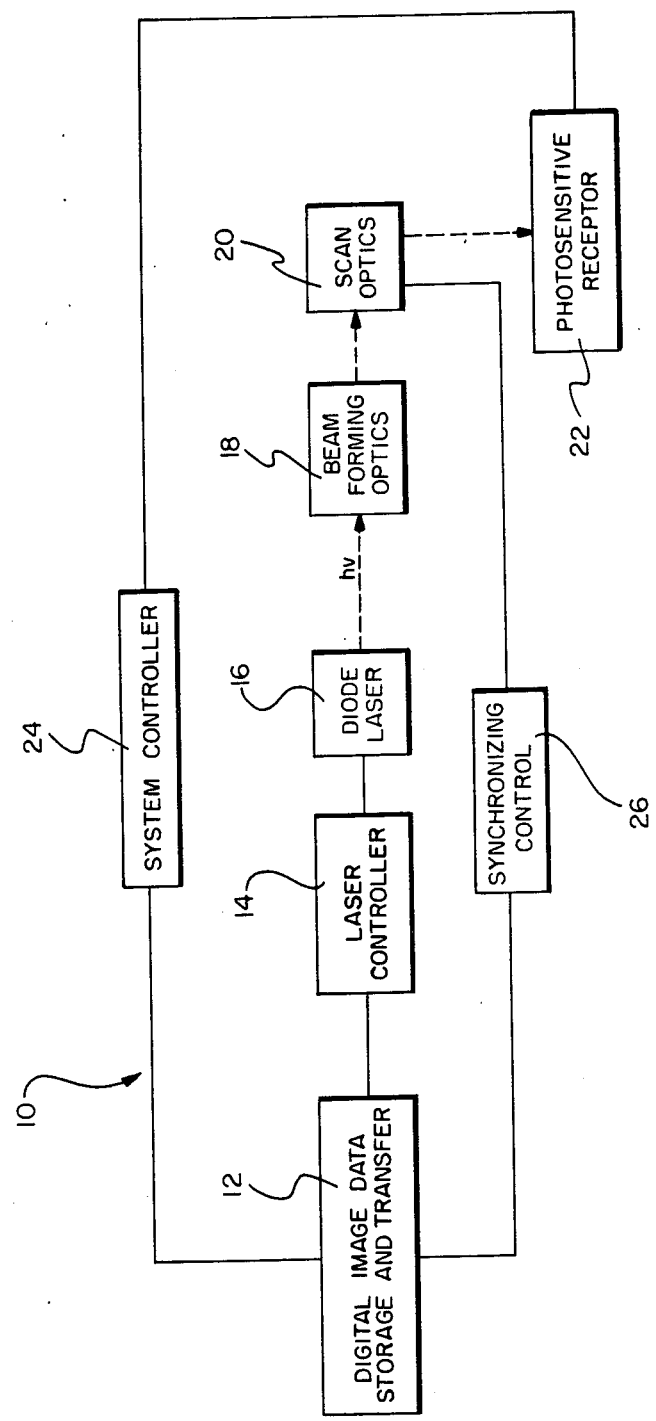
FIG. 1 is a simplified block diagram of an imaging system incorporating a conventional injection laser diode as well as the diode controller of the present invention.

Before proceeding with a more detailed description of the invention, a brief overview will be provided. In an exemplary embodiment, the controller of the present invention is incorporated within a laser printer system 10 shown schematically in FIG. 1. Digital image data is stored in a conventional digital computer 12 and transmitted, via the laser control circuit 14 of the present invention, to a laser diode 16. Light emitted from the laser diode is formed into a desired beam by conventional optics 18 and then scanned by downstream optics 20 across a photosensitive receptor 22 where the image is formed. Storage and transfer of the digital data from computer 12 to controller 14 is regulated by a conventional system controller 24 which also regulates the movement of the photosensitive receptor 22 past the scanning beam. Typically, the scan optics include a polygonal mirror which is synchronized by a synchronizing control 26 with the output of the beam forming optics 18.

Figure 2:
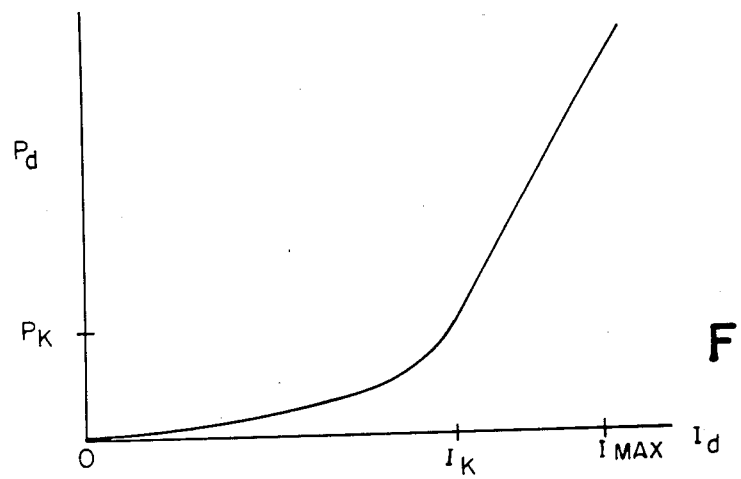
FIG. 2 is a graph of a laser diode operating curve in which output power P is a function of current 1 through the diode.

Referring now to FIG. 2, there is shown a typical operating curve of optical power output, $P_d$, versus current, $I_d$, for a conventional injection laser diode. As discussed briefly in the Background of the Invention, the curve includes a lower portion between zero and the knee current, $I_k$, where the resulting optical power output $P_d$ varies in a nonlinear manner as current $I_d$ changes, and a second higher portion between $I_k$ and I maximum current, $I_{max}$, where optical power output varies linearly with changes in current $I_d$. It can be appreciated that in the nonlinear region of the curve below $I_k$, a constant current increment along the X axis generates a non-constant increment in optical power output along the Y axis. This is unsatisfactory for generating a continuous tone image in response to image signal levels ranging between a zero output level (corresponding to maximum darkness), and a maximum signal level (corresponding to maximum brightness).

In order to overcome this problem, the laser controller of the present invention is provided to produce a linear change in illuminative output as a function of digital image data which generate signal values ranging between zero and maximum brightness. More particularly, the present invention operates in two different modes dependent upon whether the image signals would normally result in laser operation in the linear region, i.e., above the knee $I_k$, or in the nonlinear region, i.e., below $I_k$. That is, at image signal values which are above the knee region, the intensity of the illuminative output from the laser diode in forming an image pixel is a direct function of the value of the image signal input, and hence the signal level across the laser diode. This is referred to herein as the "normal linear mode" of operation.

However, if the image signal requires operation of the laser in its nonlinear region (below the knee), modulation of the diode is achieved not by linear modulation of the current $I_d$ through the diode, but rather by rapidly turning the diode on and off several times per pixel period, so that the detected output from the rapid turning on and off of the diode is an average illuminative output level per pixel period. Varying shades of gray are achieved by varying the amount of time the laser is "on" during the plurality of flashes which form one image pixel. This is referred to herein as the "linear correction mode" of operation. By insuring when the diode is turned on in the linear correction mode that it is above its knee region, the problems associated with operation in the nonlinear region are avoided.

Figures 3A, 3B:
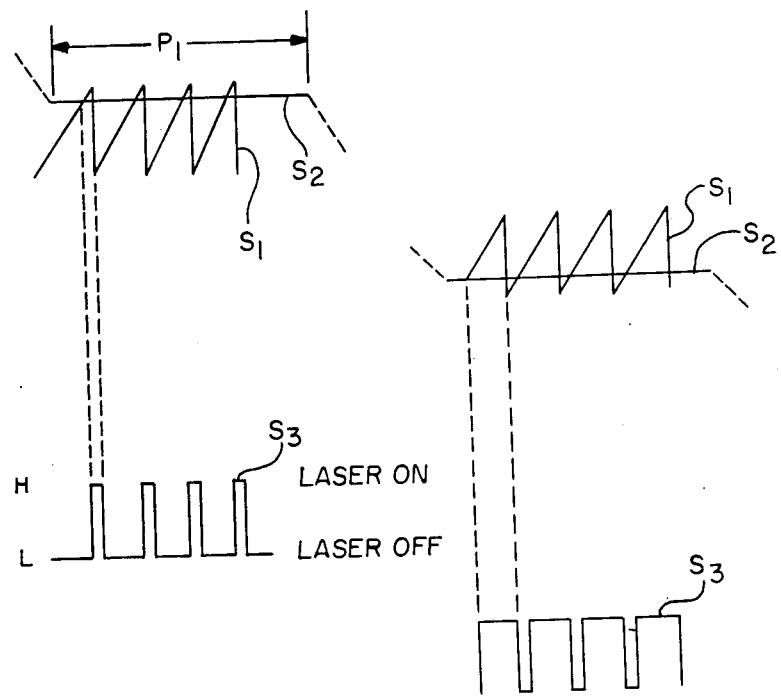
FIGS. 3A and 3B show the relationships of a reference signal $S_1$, an input image signal $S_2$, and an output signal $S_3$ which represents a difference in the $S_1$ and $S_2$ signal levels, where the input image signal $S_2$ is at a higher level in FIG. 3A than in FIG. 3B.

Operation of the diode in the linear correction mode is achieved in the present invention by generating a reference signal such as the sawtooth waveform $S_1$ shown in FIGS. 3A and 3B, and by generating a second signal $S_2$ (image signal) having a value which is a function of the brightness of the image pixel; signal $S_2$ having a period of $P_1$. By definition, signal $S_2$ corresponds to a particular digital coded output from computer 12 (FIG. 1) which represents one image pixel. Furthermore, the term "pixel period" is meant to represent a time for generating one image pixel; this period being equal to $1/(2\ f_{S2})$, where $f_{S2}$ is the frequency of the image signal.

Modulation of the light output from the diode is achieved by generating an output signal $S_3$ having a pulse width which is a function of the time in which the level of the reference signal $S_1$ exceeds the level of the image pixel signal $S_2$. As seen by comparing FIGS. 3A and 3B, as the level of the image signal $S_2$ decreases with respect to $S_1$, the pulse width of the output signal $S_3$ increases. By turning on the laser diode for a time which is proportional to the pulse width of the signal $S_3$, the average intensity of the laser output over the pixel period $P_1$ is a direct function of the image signal level. In addition, by providing a reference signal $S_1$ which has a frequency which is several times that of the image signal $S_2$, the diode is caused to flash on and off at a sufficient rate so that only an average illuminative output of the flashes over one pixel period is detected.

In order to avoid operating the diode at or below its knee region when in the "on" state in the linear correction mode, the diode is turned on to a level above its knee current. That is, when the diode is caused to flash during the pixel period to achieve an average illuminative output, during the "on" periods of the diode, "on" operation is above the knee of the diode operating curve. In addition, the pulse width of the output signal $S_3$ varies as a linear function of the change in the level of the image signal $S_1$ by utilizing a reference signal $S_2$ which has a constant frequency and amplitude. This allows the diode to be operated in a linear manner in response to image signal values which are below the knee.

Figure 4:
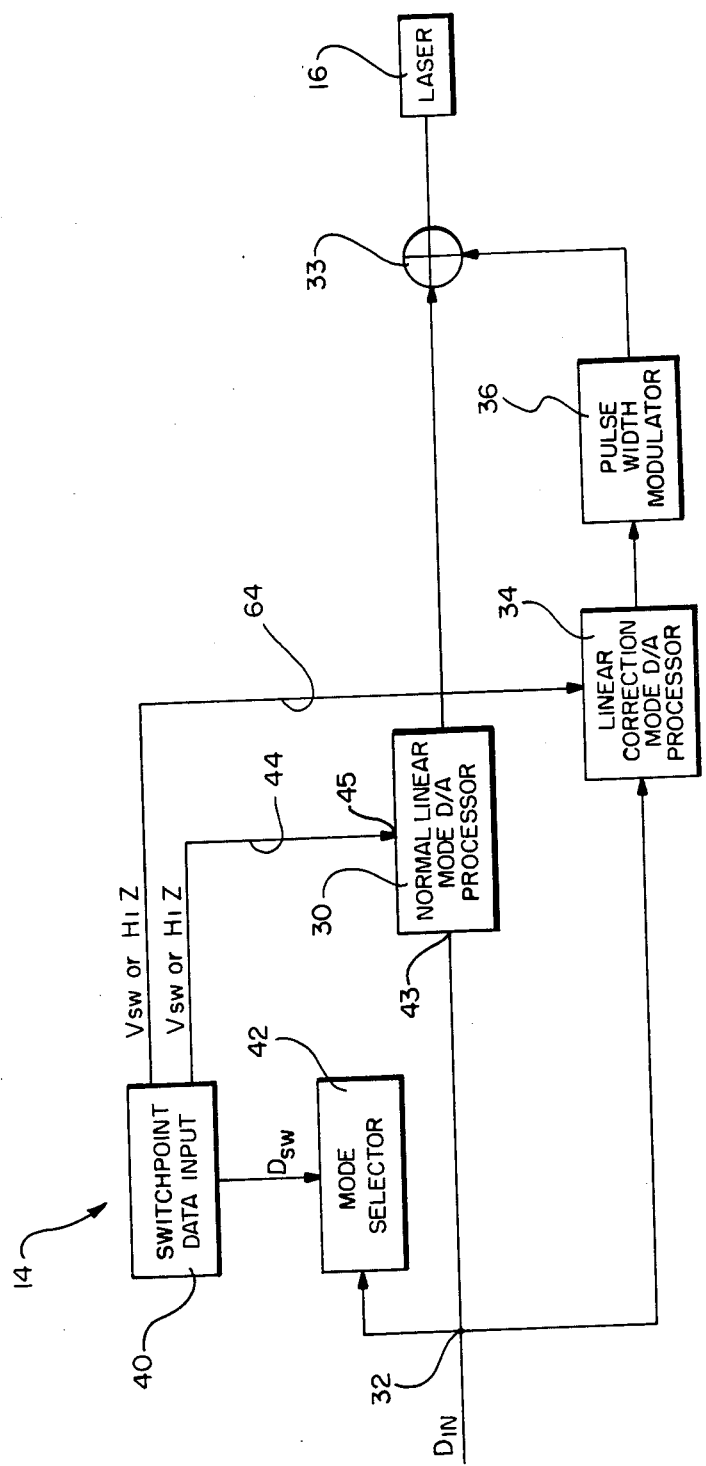
FIG. 4 is a simplified block diagram of an exemplary embodiment of the controller of the present invention.

Having provided a brief overview of the principal of operation, attention now will be turned to an exemplary embodiment for implementing the present invention. There is shown in FIG. 4 a simplified block diagram of the present embodiment, including a normal linear mode digital-to-analog processor 30 for converting digital image signals received at an input junction 32 to an analog output which is fed downstream to a summer 33. There is also shown a linear correction mode D/A processor 34 having its input tied to the junction 32 and its output tied to a pulse width modulator 36. PW modulator 36 compares the reference pulse $S_1$ with the image signal $S_2$ to generate the control signal $S_3$ described with reference to FIGS. 3A and 3B. In this embodiment, one digital word (typically twelve bits) of digital data contains the encoded intensity information for one pixel of the image display, ranging from maximum darkness (all bits are zero) to maximum brightness where all word bits are ones.

In the present embodiment, a switchpoint threshold is selected to determine whether to operate the controller 14 in the normal linear mode or in the linear correction mode. Since the knee current of the diode can be obtained in a conventional manner, a switchpoint value is selected where it is known that diode operation is well into its linear region. For example, when the maximum illuminative intensity of the diode is generated in response to an input current of about 40 milliamps, and the laser diode has an operating range between about 0 amps and about 40 milliamps, a switchpoint between normal linear mode operation and linear correction mode operation may be selected at a level of about 10 milliamps; this being about ¼ of the full scale value of 40 milliamps. In the present invention, the switchpoint current is selected so that it is above the knee current to insure that laser diode operation is always in the linear region. While the laser diode is a current driven device, the normal linear mode D/A processor 30, linear correction mode D/A processor 34, and pulse width modulator 36 all function on voltage inputs and outputs. To interface the voltage driven electronics with the current driven laser diode, a current drive amplifier (to be described later) is used to produce an output current which is proportional to the input voltage. Thus, to the laser knee current $I_k$ there corresponds a knee voltage $V_k$, and to the signal voltage $V_{in}$ there corresponds a signal current $I_{in}$ which drives the laser diode.

Referring again to FIG. 4, the switchpoint value $D_{sw}$ is entered into the switchpoint block 40 typically by means of a set of DIP switches. In order to determine whether the incoming image data requires operation of the diode in the normal linear mode or linear correction mode, a comparison is made of the input image digital signal level $D_{in}$ with the switchpoint signal value set at the switchpoint block 40. This is accomplished by feeding the image signal via the junction 32 to a mode selector 42 which compares the image signal value with the switchpoint signal value $D_{sw}$. If the image signal $D_{in}$ exceeds $D_{sw}$, then normal linear operation of the diode is called for. This is achieved by signals from the switchpoint data input block 40 which enable the normal linear mode D/A processor 30 and effectively disable the linear correction mode D/A processor 34.

On the other hand, if the image signal $D_{in}$ to the mode selector 42 is less than the switchpoint level $D_{sw}$ set at the switchpoint block 40 (calling for operation in the linear correction mode), an input 43 tied to input junction 32 is tristated (high impedance), and the linear correction mode D/A processor 34 is enabled to convert the digital image signal $D_{in}$ to its analog equivalent $V_{in}$. Furthermore, the switchpoint signal $D_{sw}$ is fed via a path 44 to an input 45 of the normal linear mode D/A processor 30, where it is output therefrom as a corresponding analog signal $V_{sw}$ to the summer 33. This analog signal is inverted further downstream, and it provides a negative voltage for reverse biasing the laser diode 16 in order to turn it on.

After $D_{in}$ has been converted to its analog equivalent $V_{in}$ at the linear correction mode D/A processor 34 (FIG. 4), it is then fed downstream to the pulse width modulator 36 to generate the control signal $S_3$. Then at locations further downstream, the control signal $S_3$ is added to $V_{sw}$ in order to control diode "on" and "off" operation in a manner to be described later.

Figure 5A:
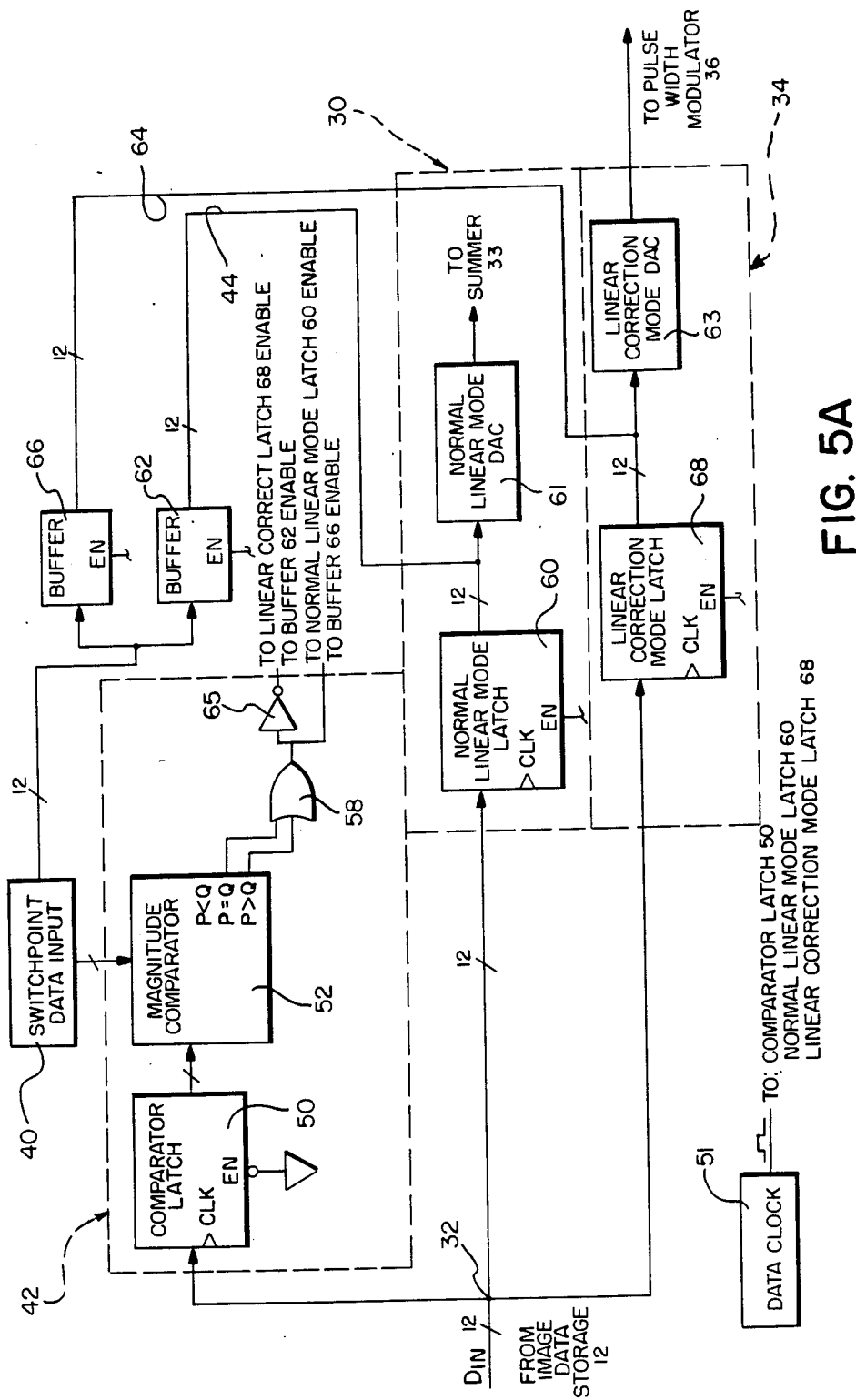
FIGS. 5A and 5B are more detailed diagrams of the controller of the present invention.
Figure 5B:
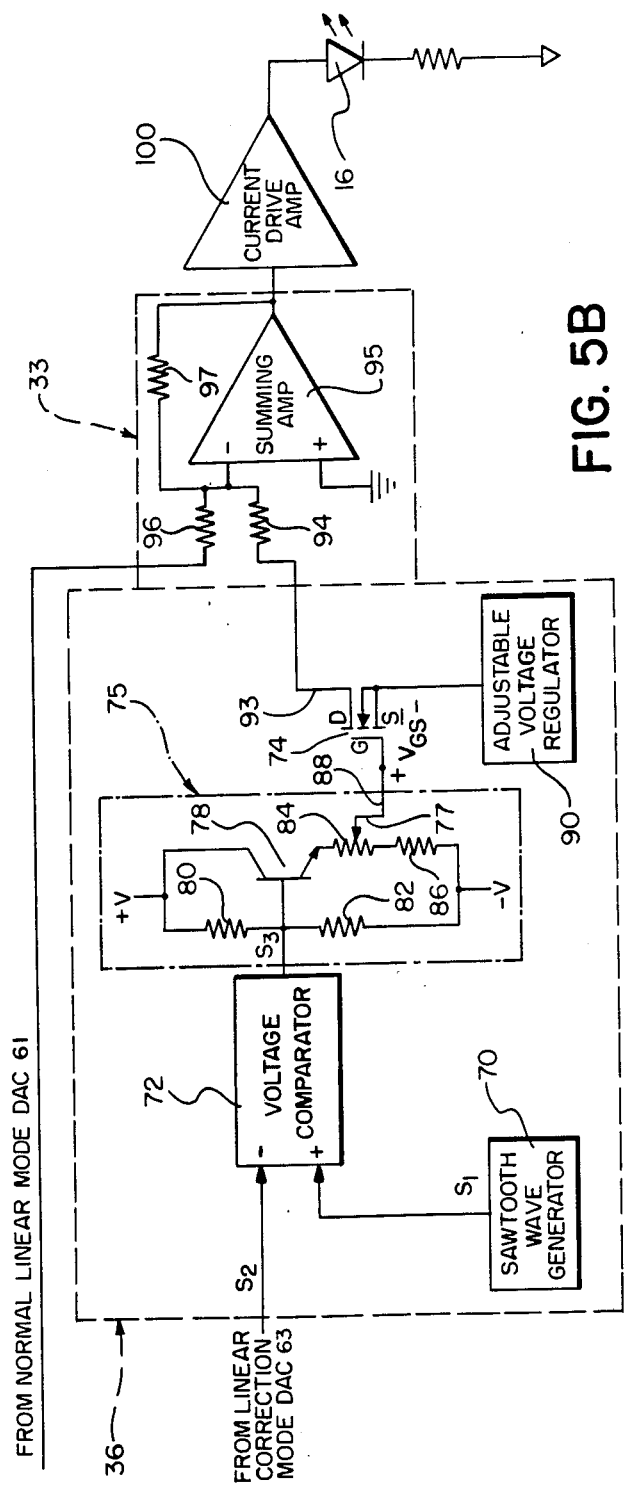

The present invention is set forth in greater detail in FIGS. 5A and 5B. Referring first to FIG. 5A, image data $D_{in}$ from computer 12 are fed via junction 32 to comparator latches 50 of the mode selector 42 where they are latched at the rising edge of a clock pulse from clock 51. The latched values are then compared at the magnitude comparator 52 with the switchpoint level $D_{sw}$ which is set by the DIP switches at switchpoint data input block 40, and in turn which is fed to the input of the magnitude comparator 52.

In the present embodiment the normal linear mode processor 30 (FIG. 5A) is formed by 1) a normal linear mode latch 60 whose input is tied to the input junction 32, and 2) a normal linear mode digital-to-analog converter (DAC) 61 whose input is tied to the output of the latch 60 and whose output is tied to the downstream summer 33. In addition there is provided a tristate buffer 62 whose input is tied to an output of the switchpoint block 40, and whose output is tied to the input of the normal linear mode DAC 61.

In this embodiment the linear correction mode processor 34 (FIG. 5A) includes 1) a linear correction mode latch 68 whose input is tied to the input junction 32, and 2) a linear correction mode DAC 63 whose input is tied to the output of the upstream latch 68, and whose output is tied to the downstream pulse width modulator 36. In addition there is provided a tristate buffer 66 whose input is tied to the output of switchpoint data block 40 and whose output is tied to the input of the linear correction mode DAC 63.

The present embodiment operates in a manner that when the image signal level $D_{in}$ is equal to or greater than the switchpoint level $D_{sw}$ (normal linear mode operation), then the magnitude comparator outputs a logic high signal through a downstream OR gate 58 to enable both the normal linear mode latch 60 and the buffer 66 (high impedance condition removed). This logic high signal is also tapped from the output of the OR gate 58 and inverted by a downstream inverter 65 in order to tristate the buffer 62 as well as the linear correction mode latch 68 In this manner, the controller is set up to process image signal values which are above the knee region of the diode.

In this normal linear mode in which the image signal levels $D_{in}$ are above the switchpoint value $D_{in}$, the image data is clocked from latch 60 (FIG. 5A) into the normal linear mode DAC 61 where they are converted to their analog equivalents ($V_{in}$) and then fed to the summer 33. Furthermore, with the buffer 66 enabled, the switchpoint signal $D_{sw}$ set at the switchpoint input 40 is fed from the buffer 66 to the input of the linear correction mode DAC 63 via a signal path 64. Since the output from the disabled linear correction mode latch 68 is high impedance, the digital switchpoint values from path 64 are input to the DAC 63, converted to their analog equivalents, and fed downstream to the pulse width modulator 36. Because the signal $V_{sw}$ output from the linear correction mode DAC 63 (signal $S_2$ in FIG. 6) is always higher than the reference signal $S_1$, the output signal from the pulse width modulator 36 (FIG. 4) to the summer 33 is tristated in a manner to be discussed later. Therefore in the linear mode of operation the only input to the summer 33 is the analog image signal $V_{in}$ from the linear mode DAC 61.

On the other hand, when the image data value is less than the selected switchpoint set at switchpoint block 40 (FIG. 5A), i.e. $D_{in}$ is less than $D_{sw}$ define the linear correction mode of operation, the output from the comparator 52 through the OR gate 58 (1) enables the linear correction mode latch 68, (2) tristates the normal linear mode latch 60, (3) enables the buffer 62, and (4) tristates the buffer 66. In this manner, the switchpoint output $D_{sw}$ from buffer 62 is output along signal path 44 to be converted to its analog equivalent $V_{sw}$ by the normal linear mode DAC 61 and then fed to the summer 33. At the same time the image signal $D_{in}$ is passed through the latch 68 where it is converted to its analog equivalent by the linear correction mode DAC 63 before being fed to the pulse code modulator 36.

Turning now to FIG. 5B, the remaining downstream portion of the invention is shown, including the pulse width modulator 36 which generates a reference waveform by means of a conventional function generator 70; the reference being a sawtooth waveform in an exemplary embodiment. The sawtooth output (signal $S_1$ in FIG. 3) has a frequency which is greater than the clock frequency of the image signal $V_{in}$ (signal $S_2$ in FIG. 3), and preferably is at least two times greater, so that the diode is caused to turn on and off at least two times during one pixel period. In this embodiment, the function generator output is phased locked to the data clock output in a conventional manner utilizing a phase delay which is selected to obtain an exact integer number of cycles of the sawtooth reference signal per pixel time period.

Comparison of the signal $S_2$ from the linear correction DAC 63 (FIG. 5A) with the reference waveform $S_1$ is accomplished by means of a conventional analog voltage comparator 72 (FIG. 5B) which has a negative input for receiving either $V_{in}$ or $V_{sw}$ from the linear correction mode DAC 63, a positive input for receiving the reference wave input $S_1$, and a TTL level output.

In the linear correction mode, the operation of the laser diode is controlled by an n-channel enhancement mode mosfet switch 74 (FIG. 5B) which has its source connected to an adjustable voltage regulator 75. Switch 74 operates in a manner that it is closed when its gate-to-source voltage (with polarity shown in FIG. 5B) is less than a $V_{GS}$(on) threshold voltage typically in the range of 0.5 to 1.5 volts, and it is open when its gate-to-source voltage exceeds the threshold voltage. In order to convert the voltage comparator output down to a range where a TTL logic low output causes the switch 74 gate-to-source voltage to be less than the $V_{GS}$(on) threshold voltage, and a TTL logic high output to be greater than the $V_{GS}$(on) threshold voltage, the comparator output is fed to a level shifting circuit indicated at 75. Level shifting allows the controller to operate with selected output voltage levels from the adjustable voltage regulator 75 and within the range of variation prescribed for valid TTL output voltage levels. The level shifting circuit 75 includes a transistor 78 having its base biased by an upper resistor 80 tied to the $+V$ supply and a lower resistor 82 tied to the $-V$ supply, and with its emitter tied through a potentiometer 84 and a series resistor 86 to the $-V$ voltage supply, and its collector tied to the $+V$ voltage supply. In response to a logic high output from comparator 72, the input to the gate of switch 74 is such that the gate-to-source voltage is greater than the $V_{GS}$(on) threshold voltage of switch 74. Correspondingly, in response to a logic low output from voltage comparator 72, the input to the gate of switch 74 is such that the gate-to-source voltage is less than the $V_{GS}$(on) threshold voltage. For a typical $V_{GS}$(on) threshold voltage of one volt and an adjustable voltage regulator 90 having an output of minus 2 volts, the resistor values for the level shifter 75 are selected so that when the voltage comparator output is a TTL high, the input to switch 74 is about $-2.0$ volts so that $V_{GS}$(on)$=0$ volts and the switch is open. In this manner the drain output of the switch 74 is tristated so that the only input to the summer 33 is the image signal $V_{in}$ from the normal linear mode DAC 61. This occurs in the normal linear mode of operation.

In this embodiment, a wiper 77 of potentiometer 84 is connected to the gate of switch 74 to allow some adjustment in the aformentioned level shifting. Furthermore, the drain output of the switch 74 is fed via a summing resistor 94 to the negative input of a downstream inverting summing amp 95 having a feedback resistor 97. In addition the negative input of the summing amp is also tied upstream though a summing resistor 96 to the output of the normal linear mode DAC 61; with the positive input of the summing amp being tied to ground. In order to avoid improperly summing the signals from the linear mode DAC 61 and from the output of switch 74, resistors 94 and 96 are matched and their resistance is much greater than the source impedance of the upstream circuit. As further shown in FIG. 5B, the summing amp 95 drives the diode 16 by means of a current drive amp 100.

Figure 6:
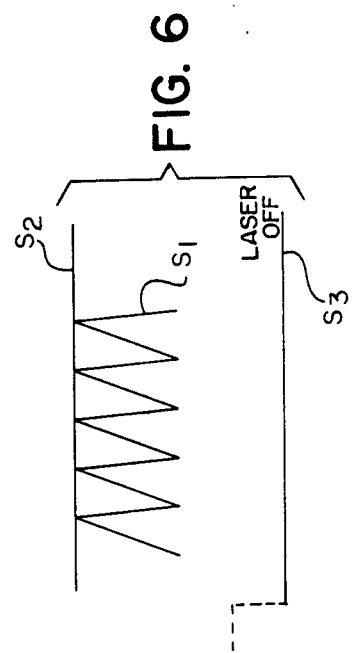
FIG. 6 is a graph similar to that shown in FIGS. 3A and 3B, however, where the input image signal $S_2$ is above the reference signal $S_1$ so that a zero difference signal $S_3$ is generated.

In the normal linear mode of operation, switch 74 is always open (because signal $S_3$ in FIG. 6 is always a logic low), so that the only input to the summing amp 95 is $V_{in}$ from the normal linear mode DAC 61. In this manner, the laser diode output is regulated only by modulation of the diode by the signal $V_{in}$.

Referring now to the linear correction mode of operation, when the output (signal $S_3$ in FIG. 3) of the comparator 72 is a logic low and therefore the input to the switch gate 74 (FIG. 5B) is less than the $V_{GS}$(on) threshold, switch 74 is opened. With switch 74 open, the only input to the summing amp 95 is the 0.375 volt switchpoint signal $V_{sw}$. This signal is inverted (to −0.375 volts) by summing amplifier 95 in order to reverse bias the laser diode and turn it on.

However, in the linear correction mode when the output from the comparator 72 is a logic high, switch 74 is closed. The closing of switch 74 feeds the −2.0 volt signal from the regulator 90 to the downstream summing amplifier 95 where it is added to the 0.375 volt switchpoint signal $V_{sw}$ from the normal linear mode DAC 61. This sum is inverted by summing amplifier 95 to generate a positive signal output of about 1.6 volts which forward biases (therefore shutting off) the downstream laser diode 16. In this manner, on and off operation of the laser diode in the linear correction mode is achieved.

What is claimed is:

1. A controller for light emitting means having a characteristic operating curve which represents illuminative output as a function of input signal levels, with the curve including a nonlinear region, a linear region, and a knee joining the linear and nonlinear regions, the controller including:
   a. receiver means for receiving input signals having first levels which are in the linear region and second levels which are in the nonlinear region, the input signal levels varying as a function of the brightness of the image;
   b. means for receiving the input signals having levels which are in the linear region, and for generating first output signals which cause the light emitting means to generate an illuminative output which changes as a linear function of changes in the input signal levels which are in the linear region; and
   c. means for receiving the input signals having levels which are in the nonlinear region and for generating second output signals which cause the light emitting means to generate an illuminative output which changes as a linear function of changes in the input signal levels which are in the nonlinear region, the levels of the second output signals changing so as to cause the light emitting means to alternate between an on state and an off state in a manner that an average illuminative output is generated, with the time in which the light emitting means is in the on and off states being a function of the input signal levels.

2. The controller as set forth in claim 1 wherein:
   a. the input signals have a first frequency and a first period; and
   b. the light emitting means is alternated between the on state and the off state during the first period at a frequency which is greater than the first frequency in a manner that each signal level generates a picture element of an image.

3. The controller as set forth in claim 2 wherein the second signal generating means includes:
   a. means for generating reference signals having frequencies which are greater than the first frequency; and
   b. means for comparing the levels of the reference signals with those of the input signals and for generating difference signals therebetween as the second output signals.

4. The controller as set forth in claim 3 wherein:
   a. the reference signal generating means includes means for generating reference signals having constant frequencies and constant maximum signal levels; and
   b. the comparing means includes means for comparing the levels of the input signals with the levels of the reference signals, and for generating the difference signals in a manner that the difference signals have pulse widths which are functions of the differences in the levels of the input signals and reference signals; and
   c. the second output signal generating means includes means for alternating the light emitting means between the on state and the off state as a function of the pulse widths of the difference signals.

5. The controller as set forth in claim 4 wherein the reference signal generating means includes means for detecting changes in the levels of the input signals with respect to the levels of the reference signals, and for determing when the levels of the reference signals exceed the levels of the input signals to generate the difference signals.

6. The controller as set forth in claim 5 wherein the reference signal generating means includes sawtooth wave generating means.

7. The controller as set forth in claim 6 wherein the detecting means includes:
   a. means for generating a threshold signal which has a level which is near the knee in the linear region; and
   b. means for comparing the threshold signal level with the levels of the input signals and for generating the first control signals when the levels of the input signals exceed the threshold signal level, and for generating the second control signals when the threshold signal level exceeds the levels of the input signals.

8. The controller as set forth in claim 1 wherein the second output signal generating means operates in a manner that the light emitting means is caused to alternate between the on state which is in the linear region and the off state which is in the nonlinear region.

9. The controller as set forth in claim 8 wherein the second output signal generating means causes the light emitting means to operate when in the off state so that there is substantially no illuminative output.

10. The controller as set forth in claim 9 wherein the receiving means includes:
   a. means for detecting the input signal levels and for generating first control signals when the levels of the input signals are in the linear region, and for generating second control signals when the input signal levels are in the nonlinear region; and
   b. first means responsive to the first control signals for generating the first output signals, and second means responsive to the second control signals for generating the second output signals.

* * * * *